United States Patent
Park et al.

(10) Patent No.: US 7,067,417 B2
(45) Date of Patent: Jun. 27, 2006

(54) METHODS OF REMOVING RESISTIVE REMNANTS FROM CONTACT HOLES USING SILICIDATION

(75) Inventors: Hee-sook Park, Seoul (KR); Gil-heyun Choi, Gyeonggi-do (KR); Jong-myeong Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 50 days.

(21) Appl. No.: 10/881,642

(22) Filed: Jun. 30, 2004

(65) Prior Publication Data
US 2005/0009328 A1    Jan. 13, 2005

(30) Foreign Application Priority Data
Jul. 9, 2003    (KR) .................... 10-2003-0046327

(51) Int. Cl.
*H01L 21/4763*    (2006.01)

(52) U.S. Cl. ............ 438/637; 438/677; 438/721; 438/755; 438/906; 438/664; 438/672; 438/675; 257/774

(58) Field of Classification Search ........... 438/637, 438/677, 721, 755, 906; 257/774
See application file for complete search history.

(56) References Cited

U.S. PATENT DOCUMENTS

| | | | | |
|---|---|---|---|---|
| 5,420,056 A | * | 5/1995 | Moslehi | 438/308 |
| 5,661,083 A | * | 8/1997 | Chen et al. | 438/637 |
| 5,700,716 A | * | 12/1997 | Sharan et al. | 438/630 |
| 5,834,367 A | * | 11/1998 | Otsuka et al. | 438/618 |
| 5,858,878 A | * | 1/1999 | Toda | 438/9 |
| 5,888,888 A | * | 3/1999 | Talwar et al. | 438/533 |
| 6,020,254 A | * | 2/2000 | Taguwa | 438/618 |
| 6,027,990 A | * | 2/2000 | Thakur et al. | 438/533 |
| 6,074,956 A | * | 6/2000 | Yang et al. | 438/721 |
| 6,093,638 A | * | 7/2000 | Cho et al. | 438/627 |
| 6,159,833 A | * | 12/2000 | Lee et al. | 438/585 |
| 6,232,239 B1 | * | 5/2001 | Lim et al. | 438/745 |
| 6,316,360 B1 | * | 11/2001 | Burton et al. | 438/679 |
| 6,400,029 B1 | * | 6/2002 | Blalock et al. | 257/774 |
| 6,458,710 B1 | * | 10/2002 | Burke | 438/713 |
| 6,500,766 B1 | * | 12/2002 | Lu et al. | 438/706 |
| 6,576,547 B1 | * | 6/2003 | Li | 438/637 |
| 6,602,785 B1 | * | 8/2003 | Sharan et al. | 438/682 |

(Continued)

FOREIGN PATENT DOCUMENTS

JP    2001-196327    7/2001

(Continued)

OTHER PUBLICATIONS

Wolf, "Silicon Processing for the VLSI Era," vol. 2, 1990, pp. 190-191.*

*Primary Examiner*—Bradley K. Smith
*Assistant Examiner*—Steven J Fulk
(74) *Attorney, Agent, or Firm*—Myers Bigel Sibley Sibley & Sajovec, PA

(57) ABSTRACT

A contact hole can be formed in an insulating layer to expose a surface of an underlying silicon layer at a bottom of the contact hole having a first size. A metal silicide layer can be formed beneath the bottom of the contact hole and removed to form a void beneath the contact hole having a second size that is greater than the first size.

23 Claims, 12 Drawing Sheets

U.S. PATENT DOCUMENTS

| | | | |
|---|---|---|---|
| 6,758,223 B1* | 7/2004 | Cowley et al. | 134/1.2 |
| 6,797,619 B1* | 9/2004 | Jang et al. | 438/685 |
| 6,840,249 B1* | 1/2005 | Seo | 134/1.2 |
| 2002/0045355 A1* | 4/2002 | Chong et al. | 438/721 |
| 2002/0197853 A1* | 12/2002 | Nagai et al. | 438/639 |
| 2003/0027429 A1* | 2/2003 | Bellandi et al. | 438/745 |
| 2003/0186525 A1* | 10/2003 | Cheong | 438/597 |
| 2004/0009660 A1* | 1/2004 | Liu et al. | 438/637 |
| 2004/0063314 A1* | 4/2004 | Sharan et al. | 438/683 |

FOREIGN PATENT DOCUMENTS

| | | |
|---|---|---|
| KR | 10-2001-0016657 | 3/2001 |

\* cited by examiner

METHODS OF REMOVING RESISTIVE REMNANTS FROM CONTACT HOLES USING SILICIDATION

This application claims the priority of Korean Patent Application No. 2003-46327, filed on Jul. 9, 2003, in the Korean Intellectual Property Office, the disclosure of which is incorporated herein in its entirety by reference.

FIELD OF THE INVENTION

The invention relates to integrated circuit devices, and more particularly, to methods of forming interconnection contacts in integrated circuit devices.

BACKGROUND

As the size of integrated circuit devices has decreased, interconnection contacts that electrically connect elements of the devices have been scaled down. Thus, contact resistance between the interconnection contacts and a conductive layer thereunder (hereinafter, a lower conductive layer) has increased.

To address the increase in contact resistance, the critical dimension (CD), or minimum size, of the interconnection contacts could be expanded. However, as the devices are scaled down, increasing the size of the interconnection contacts may be difficult. Thus, increasing contact area between the interconnection contact and a lower conductive layer, such as a conductive pad, has been considered.

FIG. 1 is a plan view of conventional contact holes 11 and 13 formed between gate lines, and FIG. 2 is a plan view of conventional contact holes 15 formed between bit lines. Referring to FIGS. 1 and 2, as devices become smaller, the sizes of contacts decrease, and the open margins associated with the contact holes 11, 13, and 15 for contacts, such as buried contacts (BCs) and conductive pads realized by self-aligned contacts (SACs), may be reduced, which may lead to an increase in the resistance between contacts, i.e., SAC pads, in the contact holes 11, 13, and 15 and a substrate, and an increased contact resistance between BCs and the SAC pads.

Contacts in DRAM devices may be particularly of interest due to the use of SAC pads formed between gate lines 20 and the BCs formed between the bit lines. In FIG. 1, first contact holes 11 for the SAC pads are formed to have elliptical shapes to increase the size whereas the overall device is scaled down. Similarly, the second contact holes 13 for the conductive pads that electrically connect bit lines to the substrate have elliptical shapes.

Because devices have been scaled down, changing the shapes of the contact holes 11 and 13 may not increase the margins for "opens" associated with the contact holes 11 and 13 sufficiently. As shown in FIG. 1, for about a 96-nm design rule, the bottom margin of each of the contact holes 11 and 13 may be limited to about 40 nm by a spacing between the gate lines 20. The bottom margin of 40 nm may be less than a set size of 120 nm of each of the first contact holes 11.

Referring to FIG. 2, third contact holes 15 for the BCs that electrically connect bit lines to capacitors also have elliptical shapes to increase their open margins. However, for about 96-nm design rules, a bottom margin 15' of each of the third contact holes 15 is only 80 nm.

The contact resistances may be increased due to the limited margins of the contact holes 11, 13, and 15 at the bottoms thereof. However, it may be difficult to sufficiently increase the bottom margins by increasing the design rule due to reductions in the design rule.

FIG. 3 is a cross-sectional view of the contact holes 11 formed between the gate lines 20 shown in FIG. 1. According to FIG. 3, the bottom margins may be further reduced by etch remnants and native oxides, which may remain on bottoms of the contact holes 11, 13, and 15 as a result of an etch process.

Referring to FIG. 3, the gate lines 20 are formed on a gate oxide layer 21, which is formed on a substrate 10. Also, a gate capping layer 23 and gate spacers 25 are formed on top surfaces and sidewalls of the gate lines 20, respectively, to facilitate a SAC process and a source/drain forming process. In this structure, each of the contact holes 11 which are formed via an insulating layer 30 between the gate lines 20 has a bottom CD of about 40 nm. Here, remnants may be generated while the contact holes 11 are being formed, and native oxides may be formed due to the exposure of the substrate 10. Thus, the remnant or the native oxides may remain on the substrate 10 as a resistive layer 17.

Although it may be possible to remove the resistive layer 17 by a cleaning process, the cleaning efficiency may be relatively low. Also, since a portion of the surface of the substrate 10 exposed by an etch process may be rough, it may be difficult to completely remove the resistive layer 17. Thus, the resistive layer 17 may cause adverse effects, such as reduction of the bottom CDs. As a result, the resistive layer 17 may increase contact resistance.

SUMMARY

Embodiments according to the invention can provide methods of removing resistive remnants from contact holes using silicidation. Pursuant to these embodiments, In some embodiments according to the invention, a contact hole can be formed in an insulating layer to expose a surface of an underlying silicon layer at a bottom of the contact hole having a first size. A metal silicide layer can be formed beneath the bottom of the contact hole and removed to form a void beneath the contact hole having a second size that is greater than the first size. An interconnection contact can be formed in the void having the second size. Accordingly, the size of the interface between the interconnection contact and the underlying silicon layer may be greater than the size of the critical dimension at the bottom of the contact hole, which may provide decreased resistance compared to conventionally formed structures.

In some embodiments according to the invention, a resistive layer, such as an etch remnants (e.g., polymers) and native oxides, can be removed from the bottom of a contact hole. Thus, when the interconnection contacts are formed on the bottom of the contact hole, the contact resistance between the interconnection contact and an underlying layer may be reduced while maintaining a relatively small critical dimension at the bottom of the contact hole. Accordingly, if the device is scaled down, the contact resistance between the interconnection contact and the underlying layer may be kept relatively low.

In some embodiments according to the invention, forming the metal silicide layer beneath the bottom of the contact hole includes forming the metal silicide layer beneath the bottom of the contact hole to a third size greater than the first size. In some embodiments according to the invention, forming a metal silicide layer beneath the bottom of the contact hole includes forming the metal silicide layer beneath the bottom of the contact hole to extend outward beyond sidewalls of the contact hole.

In some embodiments according to the invention, forming a contact hole further includes forming a resistive layer at the bottom of the contact hole on the exposed surface the silicon layer. In some embodiments according to the invention, forming a metal silicide layer includes forming a metal layer in the contact hole at the bottom thereof and annealing or applying a rapid thermal process to the metal layer.

In some embodiments according to the invention, forming a metal silicide layer includes depositing a metal layer at an environmental temperature greater that an environmental temperature needed to react the metal layer with the underlying exposed silicon layer to create the metal silicide layer. In some embodiments according to the invention, the metal layer is deposited at an environmental temperature of about 450° C. to about 700° C.

In some embodiments according to the invention, depositing a metal layer includes depositing the metal layer using atomic layer deposition, chemical vapor deposition, or physical vapor deposition. In some embodiments according to the invention, depositing a metal layer includes depositing a titanium layer using plasma-enhanced chemical vapor deposition with a titanium source at an environmental temperature of about 450° C. to about 700° C. to form a titanium silicide layer on and beneath the exposed surface of the underlying silicon layer.

In some embodiments according to the invention, removing the metal silicide layer includes wet etching using a $H_2SO_4$-containing wet etchant. In some embodiments according to the invention, a wet treatment is performed using an HF solution after the wet etching. In some embodiments according to the invention, the interconnection contacts are formed of a conductive silicon layer.

In some embodiments according to the invention, an interconnection contact can be formed by forming an insulating layer on a silicon layer. A contact hole is formed in the insulating layer to expose a surface of the silicon layer at a bottom thereof having a first size. A metal layer silicide layer is formed on the exposed surface of the silicon layer. The metal silicide layer is removed to form a void beneath the exposed surface of the silicon layer that extends outward beyond sidewalls of the contact hole. An interconnection contact is formed in the contact hole and in the void.

In some embodiments according to the invention, an interconnection contact can be formed by forming spaced-apart gate lines on a substrate. An insulating layer is formed in gaps between the gate lines. Contact holes are formed by patterning the insulating layer to expose surfaces of the substrate between the gate lines. A metal layer is formed on bottoms of the contact holes to form a metal silicide layer between the metal layer and the substrate. The metal silicide layer and the metal layer are removed and interconnection contacts are formed that fill the contact holes.

In some embodiments according to the invention, an interconnection contact can be formed by forming a first insulating layer on a substrate so that the first insulating layer surrounds first interconnection contacts. A second insulating layer is formed on the first interconnection contacts. Bit lines are formed on the second insulating layer. A third insulating layer is formed in gaps between the bit lines. Contact holes are formed in the third insulating layer and in the second insulating layer between the bit lines to expose bottom surfaces of the first interconnection contacts. A metal layer is formed on bottoms of the contact holes to form a metal silicide layer between the metal layer and the substrate. The metal silicide layer and the metal layer are removed and interconnection contacts are formed that fill the contact holes.

DETAILED DESCRIPTION OF EMBODIMENTS ACCORDING TO THE INVENTION

Figure 1:
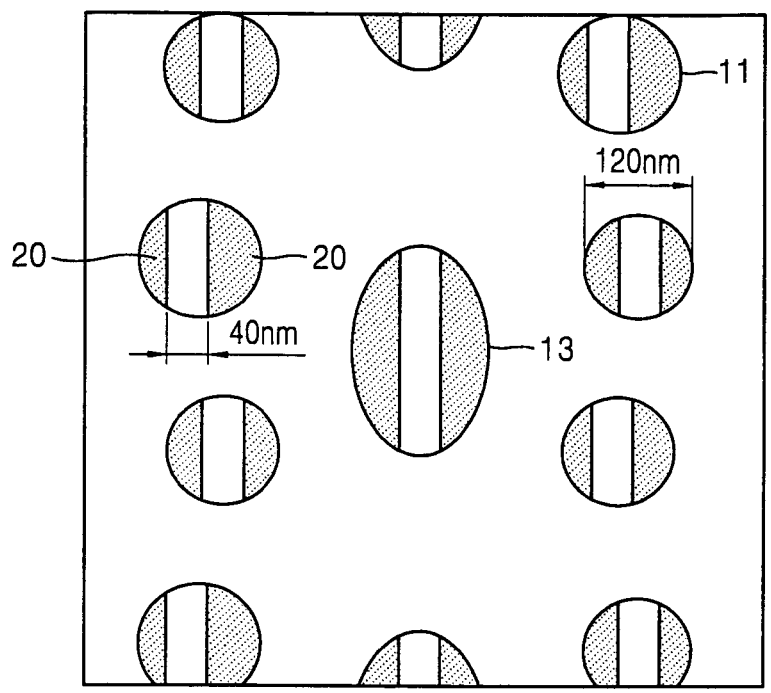
FIG. 1 is a plan view of conventional contact holes formed between gate lines.
Figure 2:
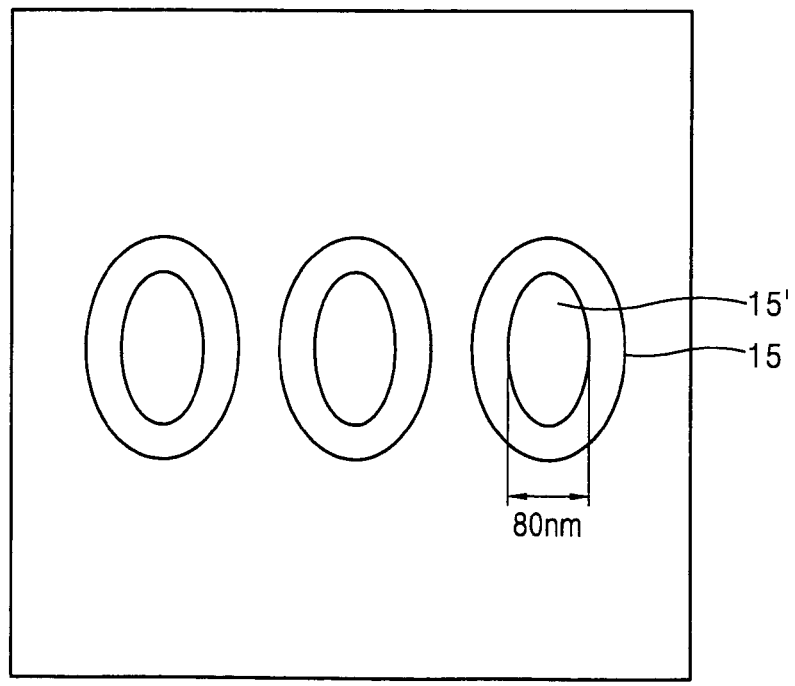
FIG. 2 is a plan view of conventional contact holes formed between bit lines.
Figure 3:
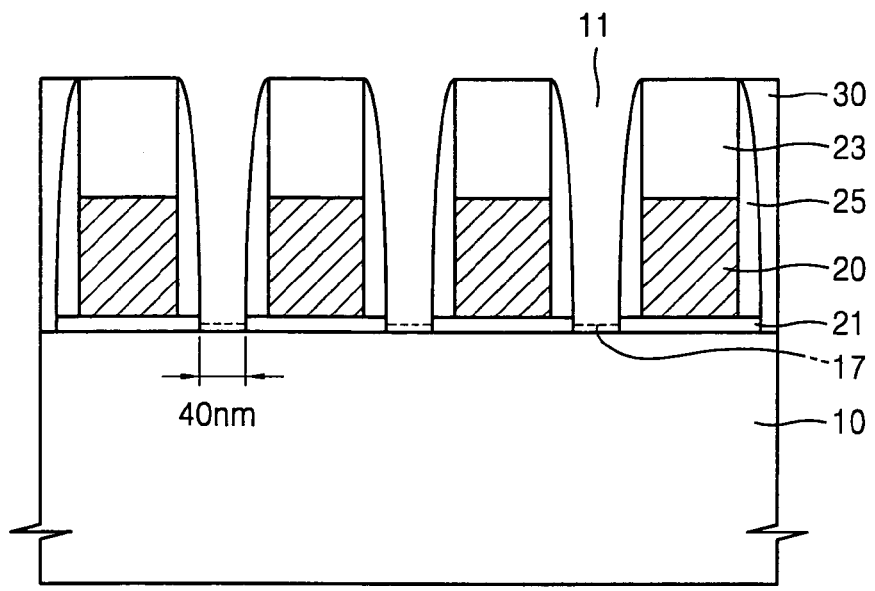
FIG. 3 is a cross-sectional view of the contact holes formed between the gate lines shown in FIG. 1.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. Furthermore, relative terms such as "below" or "above" may be used herein to describe a relationship of one layer or region to another layer or region relative to a substrate or base layer as illustrated in the figures. It will be understood that these terms are intended to encompass different orientations of the device in addition to the orientation depicted in the figures. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a contact hole illustrated as a having squared or sharp edges will, typically, have rounded or curved features rather than the exact shapes shown in the figures. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

In some embodiments according to the invention, a contact hole can be formed in an insulating layer to expose a surface of an underlying silicon layer at a bottom of the contact hole having a first size. A metal silicide layer can be formed beneath the bottom of the contact hole and removed to form a void beneath the contact hole having a second size that is greater than the first size. An interconnection contact can be formed in the void having the second size. Accordingly, the size of the interface between the interconnection contact and the underlying silicon layer may be greater than the size of the critical dimension at the bottom of the contact hole, which may provide decreased resistance compared to conventionally formed structures.

In some embodiments according to the invention, a resistive layer, such as an etch remnants (e.g., polymers) and native oxides, can be removed from the bottom of a contact hole. Thus, when the interconnection contacts are formed on the bottom of the contact hole, the contact resistance between the interconnection contact and un underlying layer may be reduced while maintaining a relatively small critical dimension at the bottom of the contact hole. Accordingly, if the device is scaled down, the contact resistance between the interconnection contact and the underlying layer may be kept relatively low.

Figure 4A:
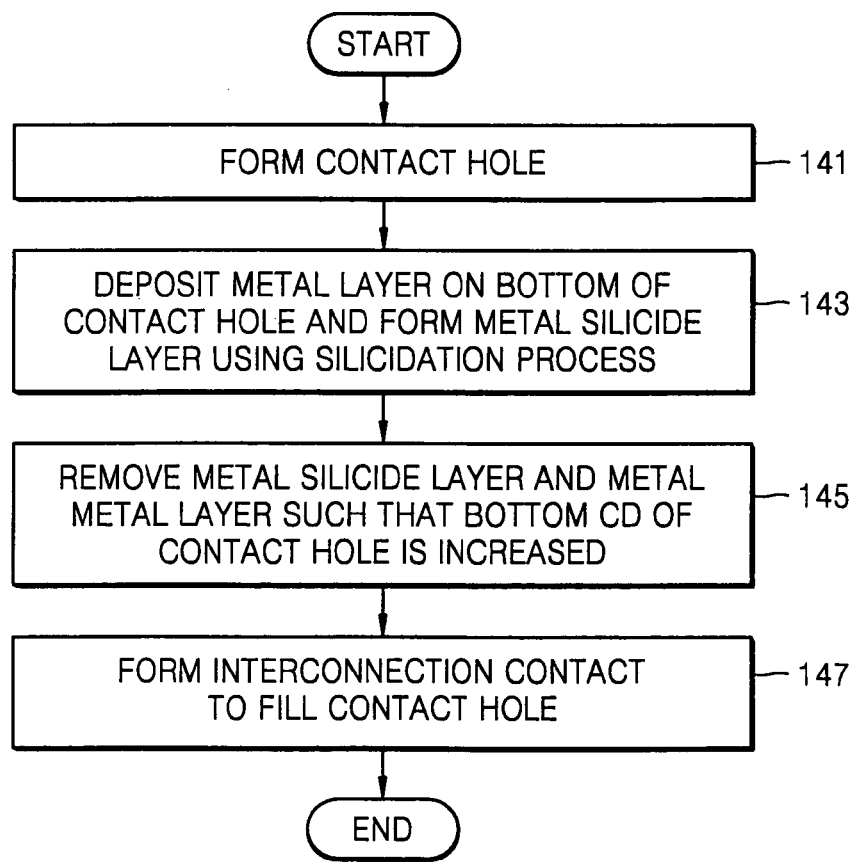
FIGS. 4A and 4B are flowcharts illustrating methods of forming interconnection contacts according to some embodiments of the invention.
Figure 4B:
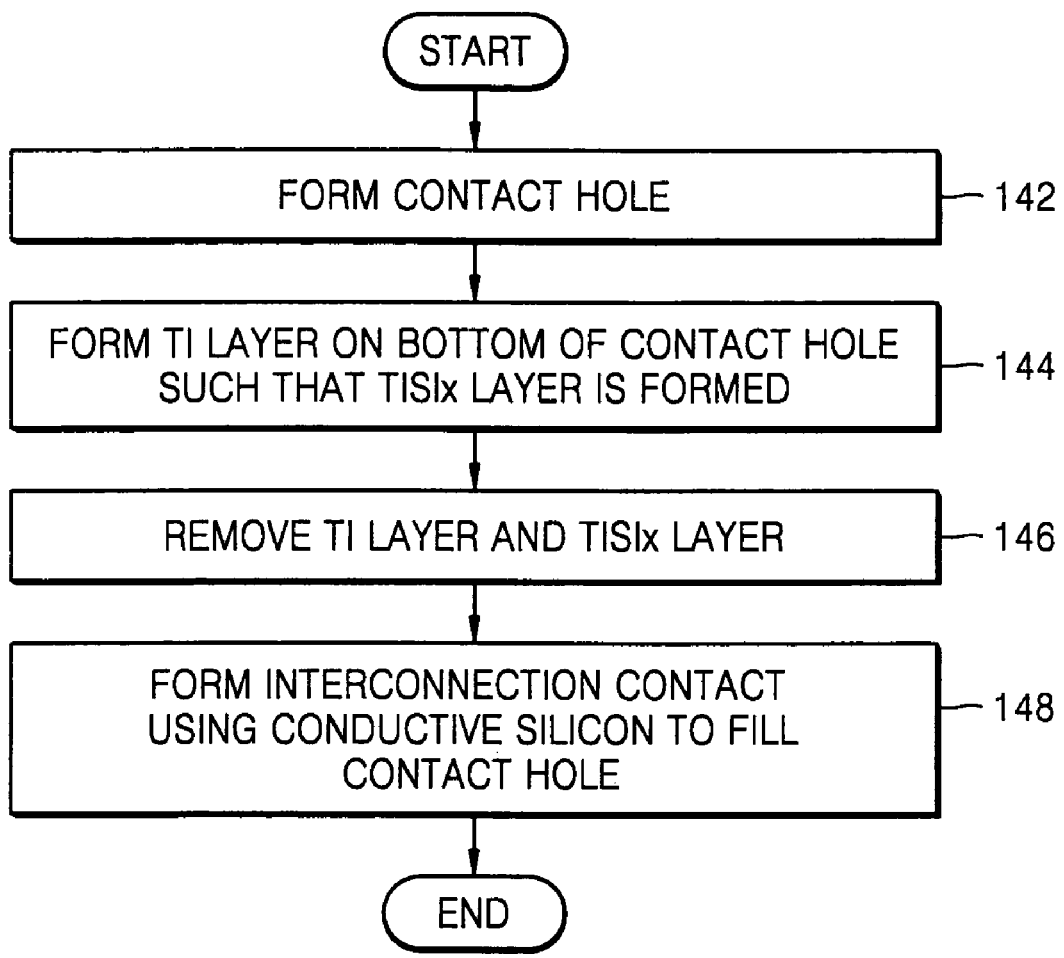

FIGS. 4A and 4B are flowcharts illustrating methods of fabricating interconnection contacts according to some embodiments of the invention. Referring to FIGS. 4A and 4B, the methods according to some embodiments of the invention can be applied to contact holes formed between gate lines, contact holes formed for electrical connection between a substrate and bit lines or contact holes formed for electrical connection between a substrate and capacitors.

Referring to FIG. 4A, in some embodiments according to the invention, contact holes are formed in step 141, and a metal layer is deposited to contact bottoms of the contact holes and silicided such that a metal suicide layer is formed, in step 143. In step 145, the metal silicide layer and the metal layer are removed such that the critical dimension (CD) of bottoms of the contact holes is increased. Interconnection contacts are formed in the contact holes in step 147. In some embodiments according to the invention, the interconnection contacts fill the contact hole.

Referring to FIG. 4B, in some embodiments according to the invention, contact holes are formed in step 142. In step 144, a titanium layer is deposited to contact bottoms of the contact holes, and a silicidation reaction occurs between the bottoms of the contact holes and the titanium layer during the deposition process, thus forming a titanium silicide (TiSi$_x$) layer. The titanium layer and the titanium silicide layer are removed in step 146, and silicon interconnection contacts are formed in the contact holes in step 148. In some embodiments according to the invention, the interconnection contacts fill the contact hole.

In some embodiments according to the invention, the titanium layer is deposited at an environmental temperature that is higher than the temperature required for the Ti silicidation reaction, such that the Ti deposition can facilitate the Ti silicidation reaction. Also, since a titanium source used for the Ti deposition can be employed as a precursor for generating chloric radicals such as TiCl$_4$, the resistive layers remaining on the bottoms of the contact holes can be effectively removed by the chloric radicals.

Figure 5:
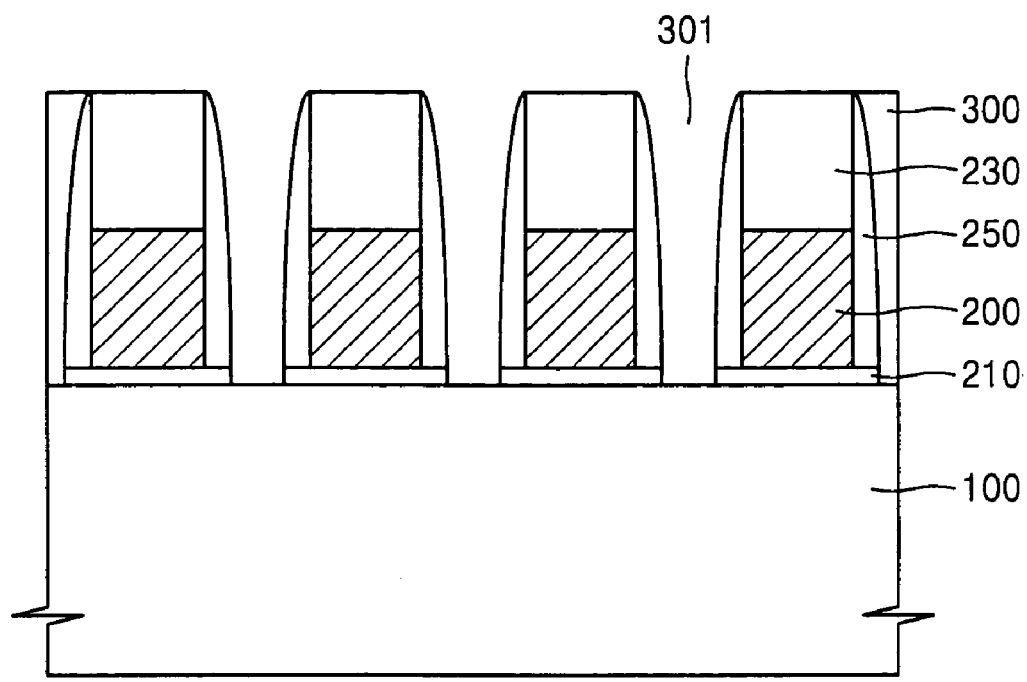
FIGS. 5 through 8 are cross-sectional views illustrating methods of forming interconnection contacts according to some embodiments of the invention.

FIGS. 5 through 8 are cross-sectional views illustrating methods of forming interconnection contacts according to some embodiments of the invention. Referring to FIG. 5, a gate line structure is formed on an integrated circuit (e.g., semiconductor) substrate 100. That is, gate lines 200 are formed on a gate oxide layer 210, which is formed on the substrate 100, and a gate capping layer 230 and gate spacers 250 are formed on a top surface and sidewalls of each of the gate lines 200, respectively, thereby providing a self-aligned contact (SAC) process and a source/drain forming process. In some embodiments according to the invention, the gate capping layer 230 and the gate spacers 250 are interlayer dielectrics (ILDs) formed of an insulating material (e.g., silicon nitride Si$_3$N$_4$) having an etch selectivity with respect to an insulating layer 300, which can be formed using silicon oxide.

The insulating layer 300 is formed as an ILD such that gaps between the gate lines 200 may be filled. Contact holes 301 are formed via the insulating layer 300 such that surfaces of an active region of the substrate 100, underlying the insulating layer 300, are exposed. The contact holes 301 can be used to form interconnection contacts (e.g., SAC pads) that electrically connect the gate lines 200 to capacitors or bit lines.

Figure 6:
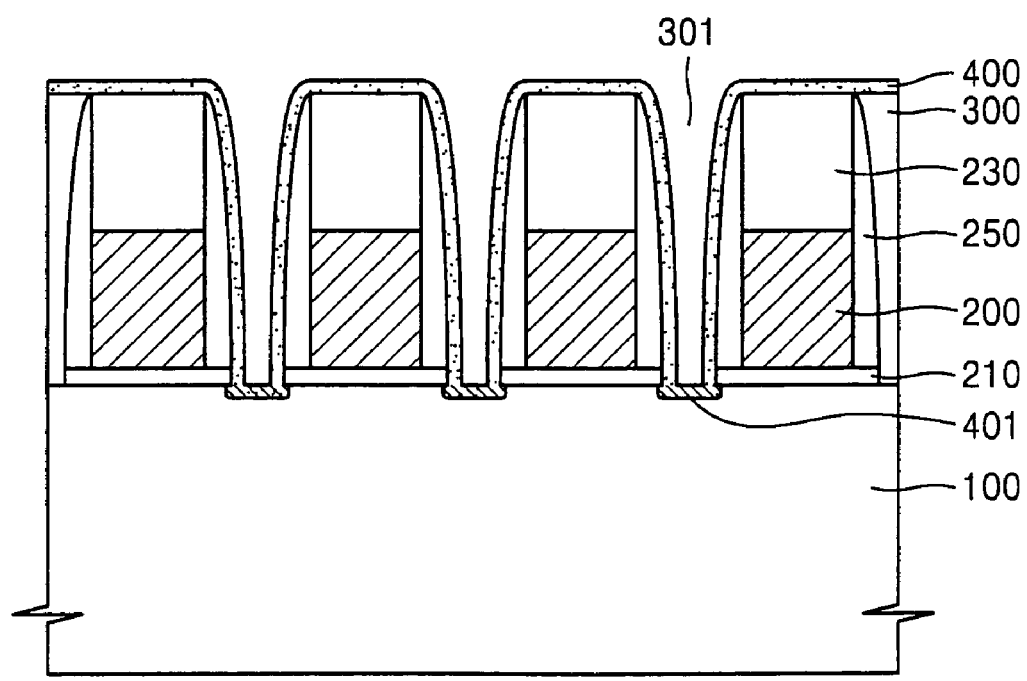

Referring to FIG. 6, in some embodiments according to the invention, a metal layer 400 is deposited to contact bottoms of the contact holes 301 have a first size. The metal layer 400 can be formed of a metal material that reacts with silicon to generate metal silicide. For example, in some embodiments according to the invention, the metal layer 400 can be formed of titanium, cobalt, tungsten, or nickel.

After the metal layer 400 is formed, a silicidation process is carried out. In some embodiments according to the invention, the metal layer 400 is heated to an environmental temperature that is higher than the temperature needed for a silicidation reaction, such that the metal of the metal layer 400 reacts with silicon in the substrate 100, thus generating a metal silicide layer (refer to 143 of FIG. 4A). As shown in FIG. 6, the metal silicide is formed beneath the bottom of the contact hole and has a size that is greater than the size of the bottom of the contact hole. In some embodiments according to the invention, the metal silicide is formed beneath the bottom of the contact hole to extend outward beyond sidewalls of the contact hole.

In some embodiments according to the invention, the metal silicidation process is performed after the metal layer 400 is deposited (for example, as a separate step). In some embodiments according to the invention, the metal layer 400 may be deposited at an environmental temperature that is higher than the temperature needed for metal silicidation, such that the deposition of the metal layer 400 facilitates the metal silicidation reaction.

For example, the metal layer 400 can be deposited using atomic layered deposition (ALD), physical vapor deposition (PVD), or chemical vapor deposition (CVD). If this deposition process is performed at an environmental temperature that is higher than the temperature needed for the metal silicidation process, metal elements of the metal layer 400 can react with silicon in the substrate 100, thus generating a metal silicide layer 401.

In some embodiments according to the invention, when a Ti metal layer 400 is deposited by plasma-enhanced CVD (PECVD) using $TiCl_4$ as a plasma source, the PECVD can be carried out at a environmental temperature of about 450° C. to 700° C., which is higher than the temperature needed for Ti silicidation. Thus, the deposition of the Ti metal layer 400 involves the Ti silicidation (refer to 144 of FIG. 4B). That is, the deposited titanium reacts with silicon in the substrate 100 that is exposed by the contact holes 301, thus generating the titanium silicide layer 401.

In some embodiments according to the invention, the Ti metal layer 400 is deposited with the PECVD at an environmental temperature of about 650° C., and plasma is generated by exciting a $TiCl_4$ gas, an $H_2$ gas, and an Ar gas. As used herein, the term "environmental temperature" refers to the temperature in, for example, in a chamber used to perform a process, such as a deposition of a metal.

In some embodiments according to the invention, the radicals such as Cl radicals or Cl plasma are generated by exciting the $TiCl_4$ gas to plasma. The Cl radicals may react with impurities, native oxides, or polymers that remain as a resistive layer on the bottoms of the contact holes 301. Thus, the Cl radicals may be used to improve the removal of the resistive layer. As a result, the bottoms of the contact holes 301 may be more effectively cleaned such that the bottom of the contact holes 301 are expanded.

In some embodiments according to the invention, an F-containing precursor is used for deposition, to provide F radicals or F-plasma for removal of the remaining resistive layer (in addition to the $TiCl_4$ gas). However, if the silicidation reaction is not facilitated by the deposition of the metal layer 400, an additional silicidation process may be performed after the metal layer 400 is formed. That is, a metal silicidation process may be induced by performing a rapid thermal process (RTP) at an environmental temperature of about 300° C. to about 1000° C. or performing an annealing process. In some embodiments according to the invention, since the metal layer 400 is formed to increase the bottom CDs of the contact holes 301, the thickness of the metal layer 400 is not very important. Thus, the metal layer 400 may be formed to a thickness of about 5 Å to 200 Å.

Figure 7:
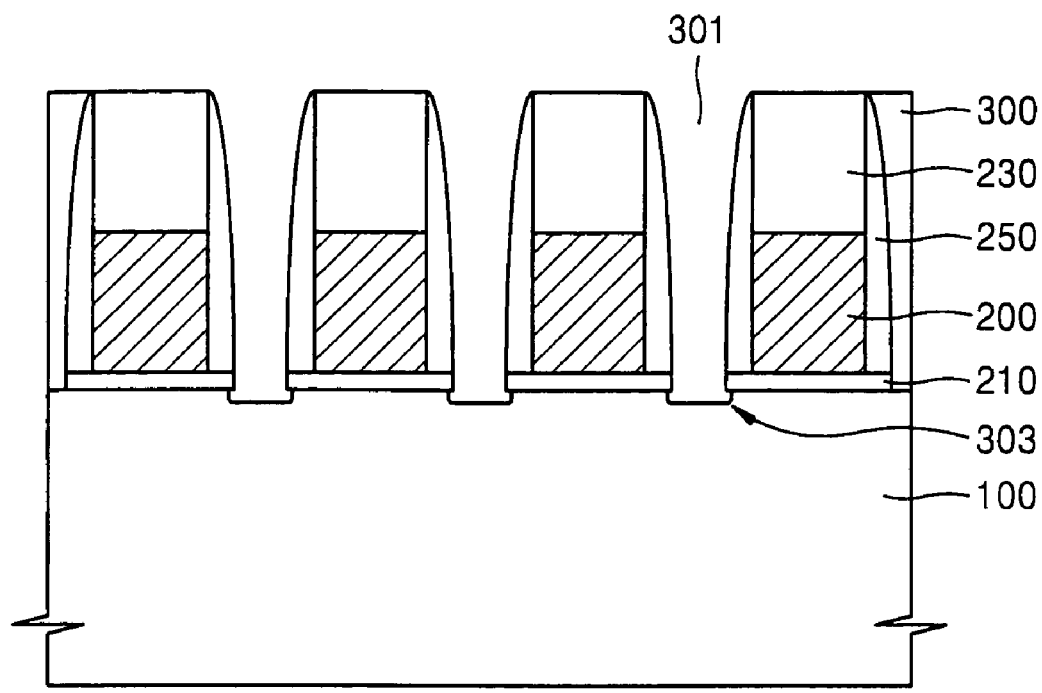

Referring to FIG. 7, in some embodiments according to the invention, the metal layer 400 and the metal silicide layer 401 are removed from the contact holes 301. This removal process may be performed by wet etching using a wet etchant for metal stripping. For example, the removal process can be performed by $H_2SO_4$ stripping. Also, the $H_2SO_4$ stripping process may be followed by a dipping process using a diluted HF solution. In some embodiments according to the invention, the HF dipping process is carried out for a very short amount of time, for example, about 8 to 30 seconds. That is, the HF dipping process may function as a pre-processing cleaning process prior to deposition of interconnection contacts. As shown in FIG. 7, removing the metal silicide underlying the bottom of the contact hole forms a void that has a size that is greater than the size of the bottom of the contact hole.

By forming and removing the metal layer 400 and the metal silicide layer 401, etch remnants, polymers, and native oxides, which may remain as the resistive layer on the bottoms of the contact holes 301, may be more effectively removed. Some of the etch remnants, polymers, and native oxides may be incorporated in the metal silicide layer 401 during the metal silicidation, and then can be removed when the metal silicide layer 401 is removed.

In the above-described process, the impurities such as etch remnants or polymers, which are generated by the etch process for forming the contact holes 301 and then remain on the bottoms of the contact holes 301, and the native oxides caused by the exposure of the bottoms of the contact holes 301 may be more effectively removed. Thus, the critical dimension of the bottom of the contact holes 301 may be effectively increased because of the greater size of the void formed underlying the bottom of the contact hole.

Also, since the metal silicidation occurs between the silicon in the substrate 100 at the bottoms of the contact hole 301 and the metal of the metal layer 400, when the metal silicide layer 401 is removed, the bottoms of the contact holes 301 are slightly recessed into the substrate 100. Thus, recesses 303 are formed in the exposed surfaces of the substrate 100, in vertical and horizontal directions. As the bottoms of the contact holes 301, i.e., the exposed surfaces of the substrate 100 are recessed, the plasma damage layer caused by the etch process for forming the contact holes 301 is removed, which may help cure effected areas of the substrate 100.

Figure 8:
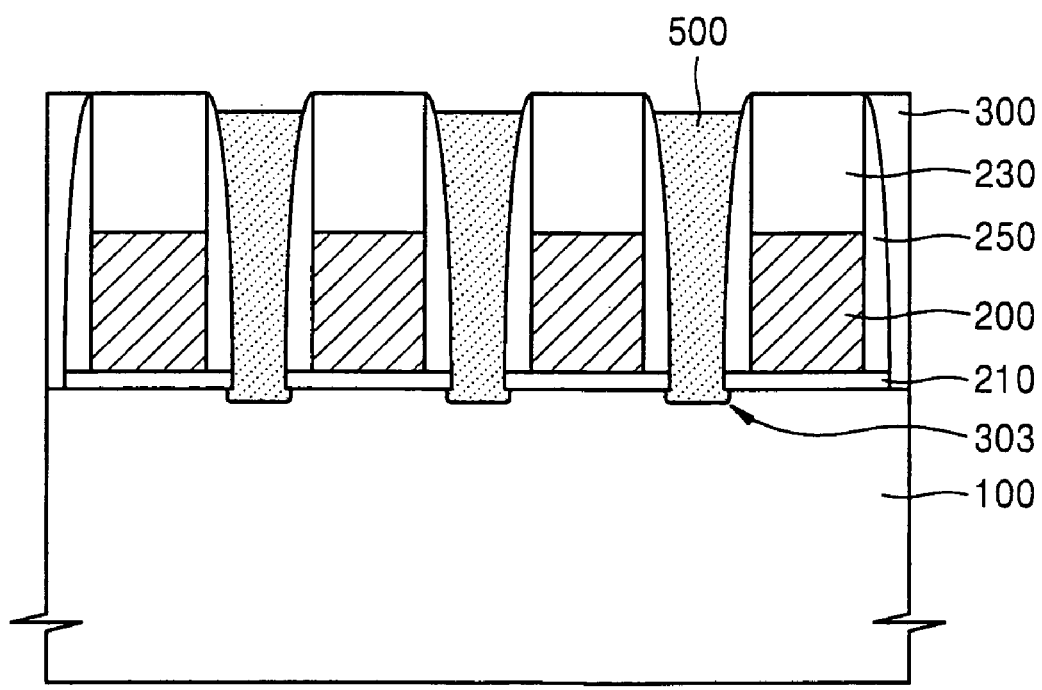

Referring to FIG. 8, in some embodiments according to the invention, after the metal layer 400 and the metal silicide layer 401 are removed, the contact holes 301 can be filled with a conductive material to form interconnection contacts 500, i.e., SAC pads on the exposed surfaces of the substrate 100. in some embodiments according to the invention, the interconnection contacts 500 are formed of a silicon material such as conductive polysilicon having a good gap filling characteristic.

As described above, an increase in contact resistance between the interconnection contacts 500 and the substrate 100, that may be caused by the downscaling of devices, may be reduced by increasing the bottom margins of the contact holes 301. As a result, resistive failures, which result from increased contact resistance or opening failures of the contact holes and single bit failures, may be reduced.

Figure 9:
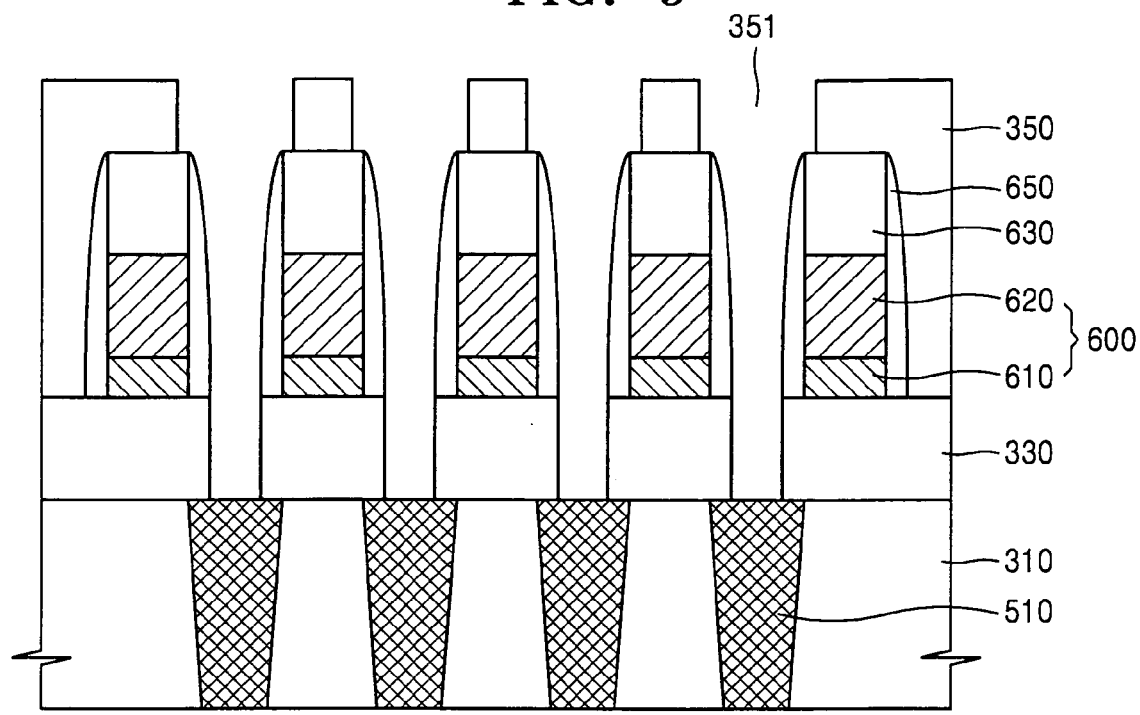
FIGS. 9 through 12 are cross-sectional views illustrating methods of forming interconnection contacts according to some embodiments of the invention.

Embodiments according to the invention can also be applied to the formation of buried interconnection contacts (BC) between bit lines, as shown in FIGS. 9 through 12. In particular, FIGS. 9 through 12 are cross-sectional views illustrating methods of forming interconnection contacts according to some embodiments of the invention. Referring to FIG. 9, a bit line structure is formed on a substrate (not shown). For example, in some embodiments according to the invention, a first insulating layer 310 is formed as an ILD on the substrate, and first interconnection contacts 510 (e.g., SAC pads) are formed via the first insulating layer 310 as described in reference to FIGS. 4 through 8. Thereafter, a second insulating layer 330 is formed as an ILD on the first interconnection contacts 510 and the first insulating layer 310. The second insulating layer 330 is formed of an insulating material such as silicon oxide.

Bit lines 600 are formed on the second insulating layer 330. To form the bit lines 600, a conductive polysilicon layer for a first conductive layer 610 is formed on the second insulating layer 330, and then a metal layer (e.g., a tungsten layer) for a second conductive layer 620 is formed thereon. A bit line capping layer 630 and bit line spacers 650 are formed on a top surface and sidewalls of each of the bit lines 600 such that contact holes are formed using a SAC process. The bit line capping layer 630 and/or the bit line spacers 650 are formed as ILDs using an insulating material (e.g., silicon nitride) having an etch selectivity with respect to a third insulating layer 350 that will be formed of silicon oxide.

The third insulating layer 350 is formed as an ILD, in gaps between the bit lines 600. Contact holes 351 are formed via the third insulating layer 350 and the second insulating layer 330 such that the contact holes 351 are aligned with the first interconnection contacts 510. The contact holes 351 are used to form interconnection contacts (e.g., BCs) that electrically connect the bit lines 600 to capacitors that are formed later.

Figure 10:
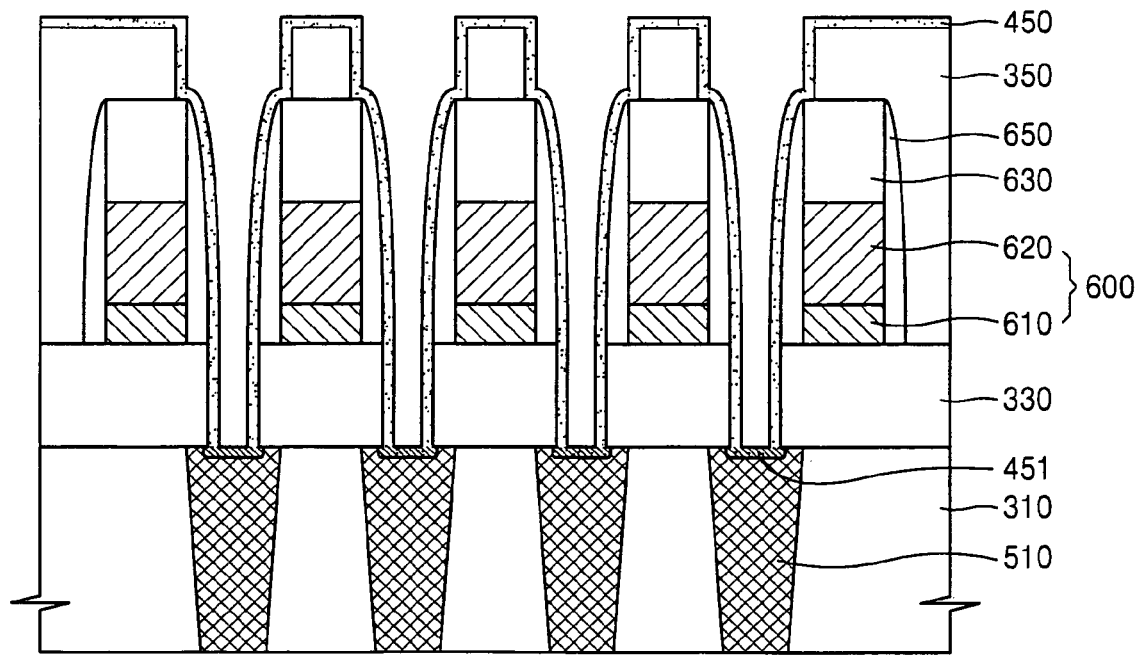

Referring to FIG. 10, a metal layer 450 is deposited to contact the bottoms of the contact holes 351. As described in reference to FIGS. 4 through 8, the metal layer 450 can be formed of a material that reacts with silicon so as to generate a metal silicide. For example, the metal layer 400 can be formed of titanium, cobalt, tungsten, or nickel with a thickness of about 5 Å to about 200 Å.

In some embodiments according to the invention, after the metal layer 450 is formed, a silicidation process is carried out. The metal layer 450 is heated to an environmental temperature higher than the temperature needed for silicidation. Thus, when the first interconnection contacts 510 are formed of conductive silicon, metal elements of the metal layer 450 that contact the silicon of the first interconnection contacts 510 react with the silicon such that a metal suicide layer 451 is generated.

The deposition of the metal layer 450 and the silicidation process can be performed as described in reference to FIGS. 4 through 8. For example, the metal layer 450 can be deposited using ALD, PVD, or CVD. If the metal layer 450 is deposited at an environmental temperature that is higher than the temperature needed for metal silicidation, the deposition process involves the metal silicidation. Thus, metal elements of the metal layer 450 react with the silicon, thus generating the metal silicide layer 451.

As shown in FIG. 10, the metal silicide is formed beneath the bottom of the contact hole and has a size that is greater than the size of the bottom of the contact hole. In some embodiments according to the invention, the metal silicide is formed beneath the bottom of the contact hole to extend outward beyond sidewalls of the contact hole.

In some embodiments according to the invention, when a Ti metal layer 450 is deposited by PECVD using $TiCl_4$ as a plasma source, the PECVD can be carried out at an environmental temperature of about 450° C. to 700° C., so as to generate a Ti silicide layer 451.

In some embodiments according to the invention, radicals such as Cl radicals or Cl plasma are generated by exciting $TiCl_4$ to plasma along with an $H_2$ gas and an Ar gas during the Ti deposition. The Cl plasma reacts with impurities, native oxides, or polymers, which remain as a resistive layer on the bottoms of the contact holes 351. Thus, the Cl plasma may more effectively remove the resistive layer.

In some embodiments according to the invention, if the silicidation reaction is not facilitated by the deposition of the metal layer 450, an additional silicidation process may be performed after the metal layer 450 is formed. That is, a metal silicidation process may be induced by performing an RTP process at an environmental temperature of about 300° C. to 1000° C. or performing an annealing process.

Figure 11:
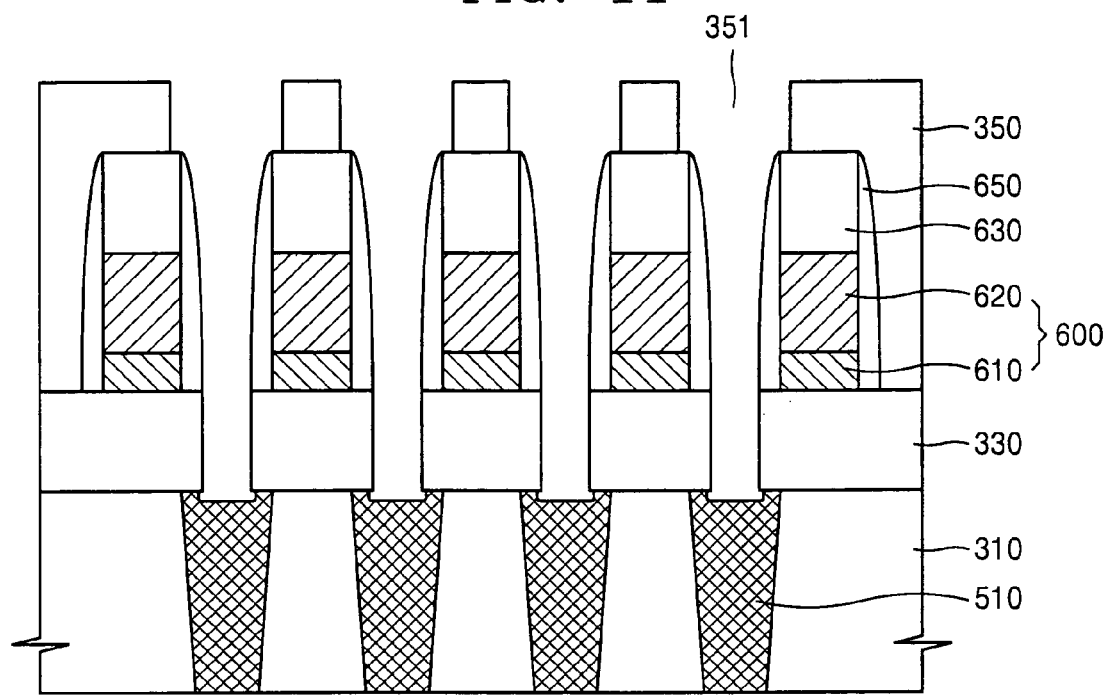

Referring to FIG. 11, the metal layer 450 and the metal silicide layer 451 are removed from the contact holes 351. As described in reference to FIGS. 4 through 8, this removal process may be performed by wet etching using a wet etchant for metal stripping, for example, $H_2SO_4$ stripping. Also, the $H_2SO_4$ stripping process may be followed by a dipping process using a diluted HF solution. That is, the HF dipping process may function as a pre-processing cleaning process before deposition of interconnection contacts. As shown in FIG. 11, removing the metal silicide underlying the bottom of the contact hole forms a void that has a size that is greater than the size of the bottom of the contact hole.

By forming and removing the metal layer 450 and the metal silicide layer 501, a portion of the surface of the first interconnection contact is recessed beneath the first interconnection contacts 510. Also, the impurities such as etch remnants or polymers, which are generated by the etch process used to form the contact holes 351 and remain on the bottoms of the contact holes 351, as well as the native oxides caused by the exposure of the bottoms of the contact holes 301 may be more effectively removed. Thus, the critical dimension of the bottom of the contact holes 301 may be increased.

Figure 12:
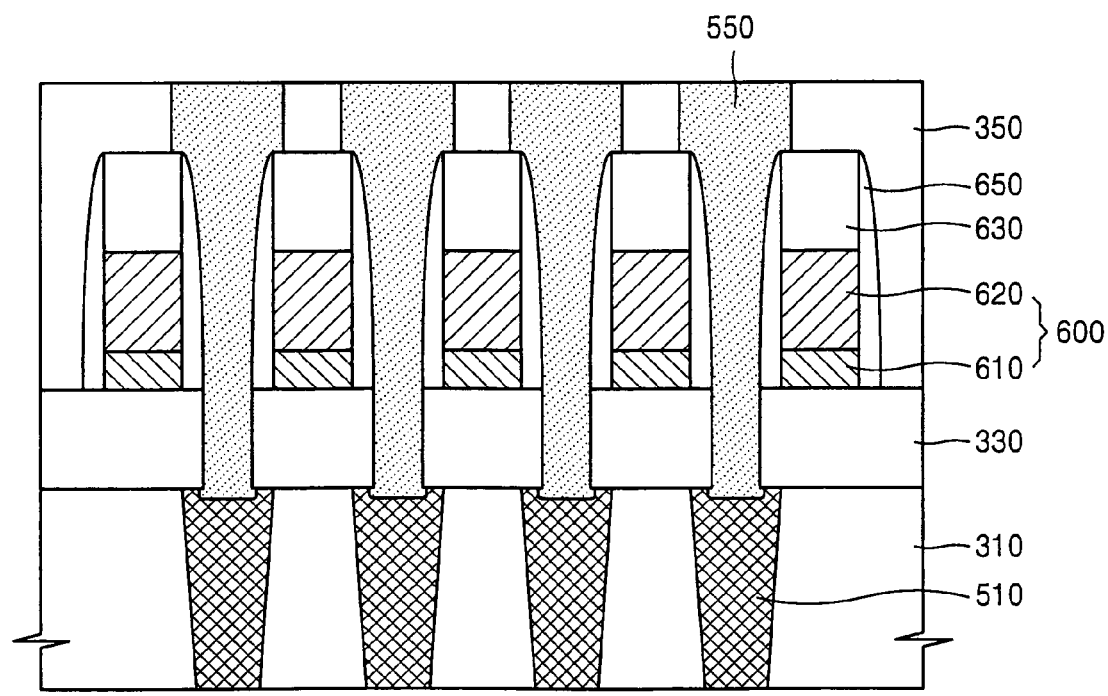

Referring to FIG. 12, after the metal layer 450 and the metal silicide layer 451 are removed, the contact holes 351 can be filled with a conductive material such that second interconnection contacts 550, i.e., BC pads are formed on the exposed surfaces of the first interconnection contacts 510 so as to electrically connect capacitors to the substrate (not shown). In some embodiments according to the invention, the second interconnection contacts 550 are formed of a silicon material such as conductive polysilicon having a good gap filling characteristic.

As described above, an increase in contact resistance between the interconnection contacts 550 and the first interconnection contacts 510, that may be caused by the downscaling of devices, may be reduced by increasing the bottom margins of the contact holes 351. As a result, resistive failures, which result from increased contact resistance or opening failures of the contact holes and single bit failures, may be reduced.

After contact holes for interconnection contacts are formed, contact hole spacers may be formed before formation of the interconnection contacts to protect sidewalls of the contact holes, which may further downscale the critical dimension of the bottoms of the contact holes and increase the contact resistance or an opening failure of the contact holes. Further, if an ILD for sidewalls of the contact holes is formed of an insulating material such as a flowable oxide (FOX), which may be vulnerable to an etch process or a cleaning process, the contact hole spacers may be needed to protect the insulating material from chemicals used for the etch process or the cleaning process.

However, since the formation of the contact hole spacers may decrease the critical dimension of the bottom of the contact holes, a further reduction in the contact resistance between interconnection contacts and bottoms of the contact holes may be desirable. Also, if the contact hole spacers are formed, silicon nitride remnants may remain on the bottoms of the contact holes or a damaged layer may be generated due to an anisotropic dry etch process. These remnants or the damage layer can function as a resistive layer that increases the contact resistance unless otherwise addresses using embodiments according to the invention.

Figure 13:
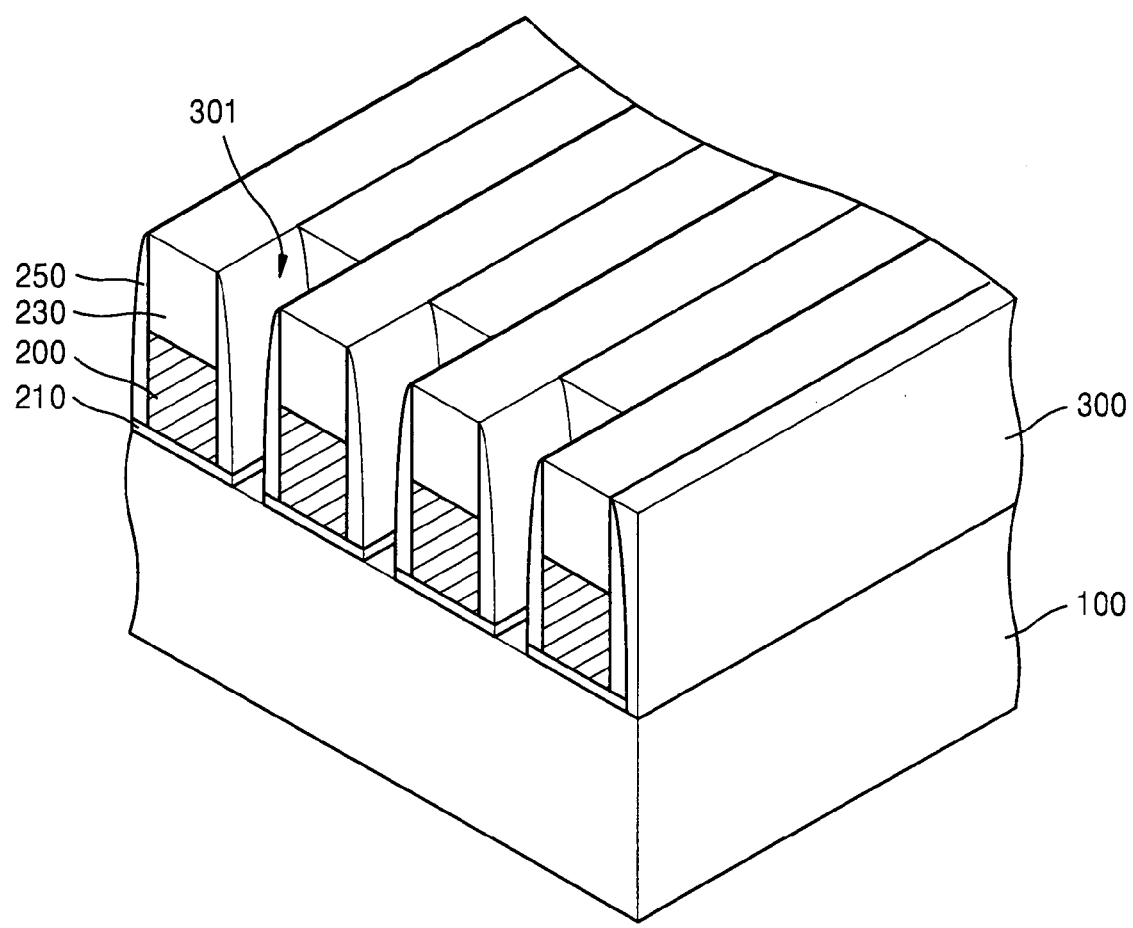
FIGS. 13 through 17 are cross-sectional views illustrating methods of forming interconnection contacts according to some embodiments of the invention.

FIGS. 13 through 17 are cross-sectional views illustrating methods of forming interconnection contacts according to some embodiments the invention. Referring to FIG. 13, gate lines 200 are formed on a gate oxide layer 210, which is formed on a substrate 100. A gate capping layer 230 and gate spacers 250 are formed on a top surface and sidewalls of each of the gate lines 200, respectively, to facilitate a SAC process and a source/drain forming process. An insulating layer 300 is formed as an ILD in gaps between the gate lines 200. Contact holes 301 are formed via the insulating layer 300 such that surfaces of an active region of the substrate 100 are exposed.

Figure 14:
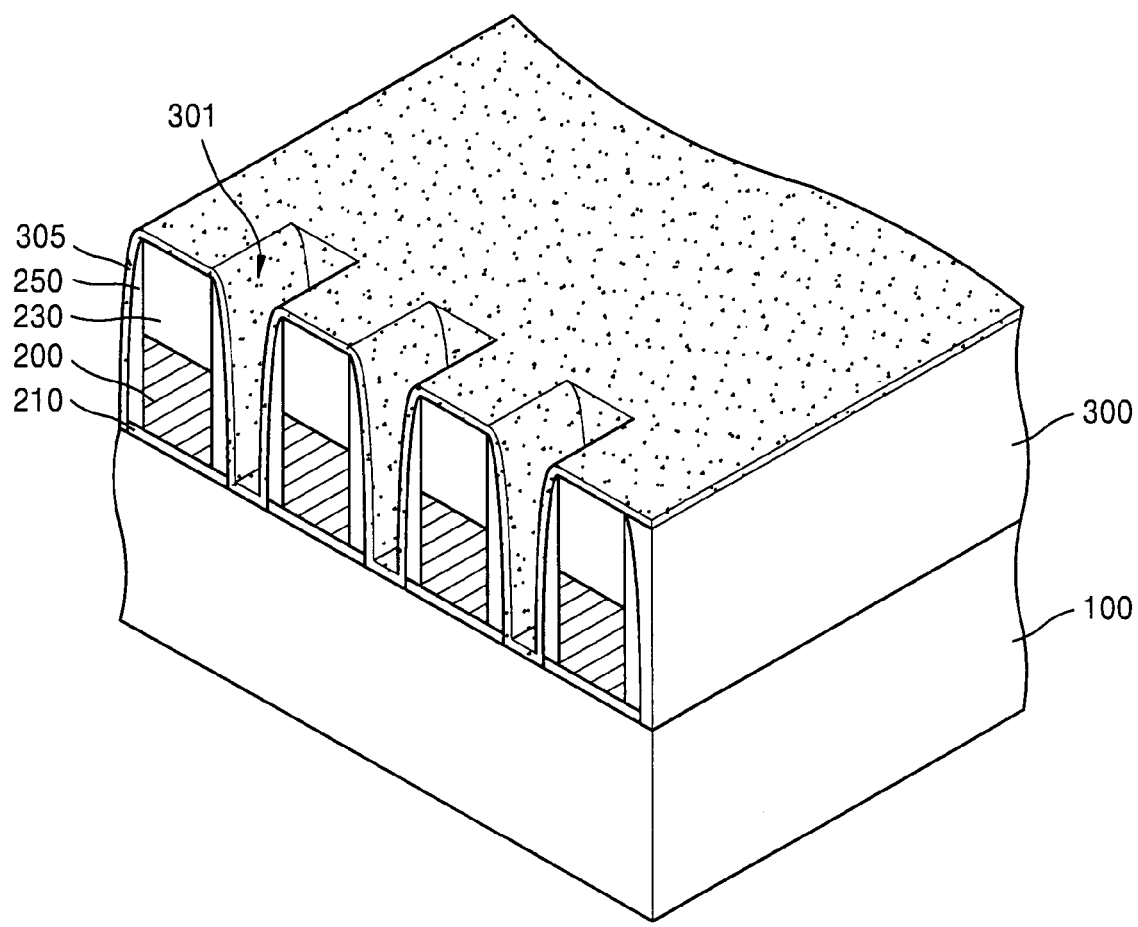

Referring to FIG. 14, a contact hole spacer layer 305 is formed to cover at least sidewalls of the contact holes 301. If the insulating layer 300 is formed of an insulating material that is vulnerable to an etch process or a cleaning process, the contact hole spacer layer 305 protects the insulating layer 300 formed on the sidewalls of the contact holes 301 from the etch process or the cleaning process. Thus, the contact hole spacer layer 305 is formed of an insulating material (e.g., silicon nitride) that is resistant to chemicals used for the etch process or the cleaning process. For example, in some embodiments the invention, the contact hole spacer layer 305 can be formed of a silicon nitride with a thickness of about 78 Å. Thus, the critical dimension of the bottom of the contact holes 301 may be decreased.

Figure 15:
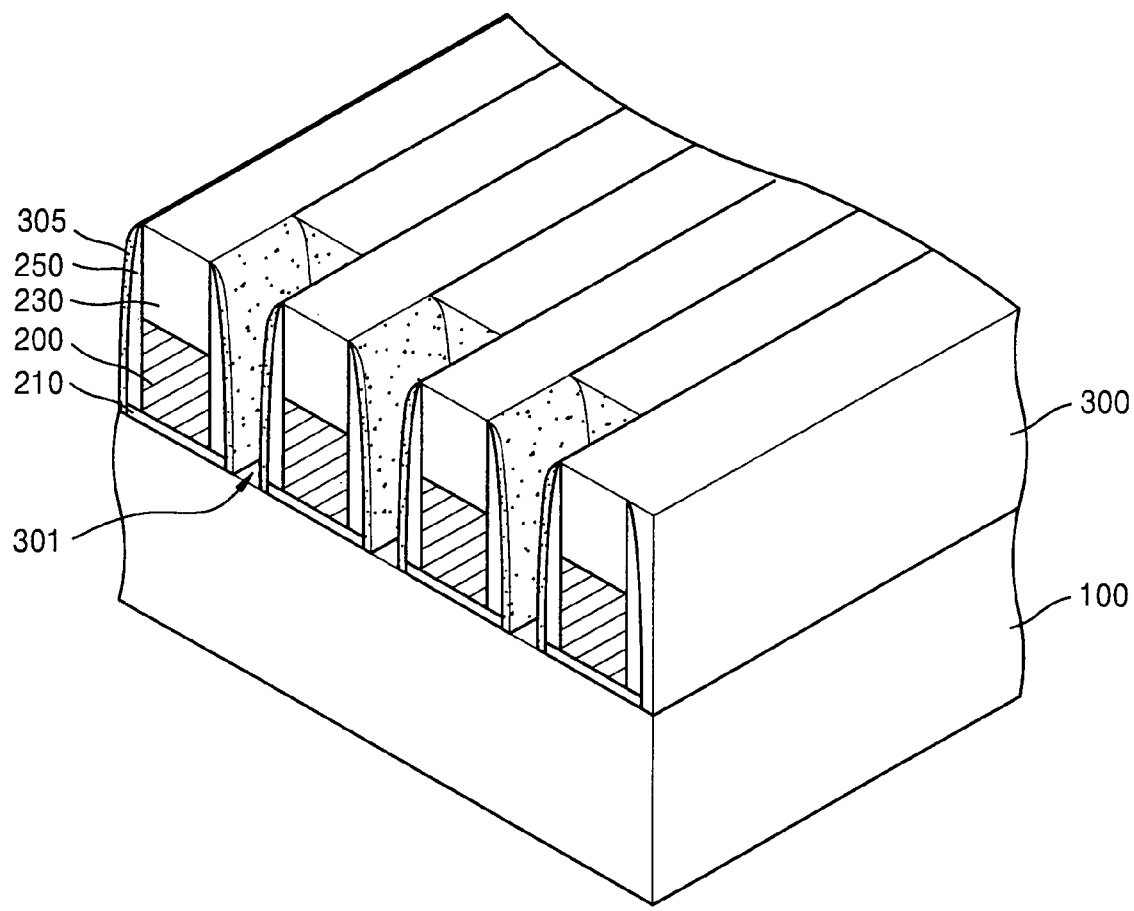

Referring to FIG. 15, the contact hole spacer layer 305 is anisotropically dry etched, thereby forming contact hole spacers 305 that cover and protect the sidewalls of the contact holes 301. Once the contact holes 301 are formed, while any two opposite sidewalls of the contact hole 301 are comprised of gate spacers 250, other two opposite sidewalls of the contact hole 301 are comprised of the insulating layer 300. The insulating layer 300 may be damaged due to a cleaning solution or an etchant, and the contact hole spacers 305 are formed to prevent the damage to the insulating layer 300.

By forming the contact hole spacers 305, a resistive layer formed of, for example, remnants caused by the etch process for forming the contact hole spacers 305 and/or a damage layer caused by plasma generated during the etch process can be generated.

Figure 16:
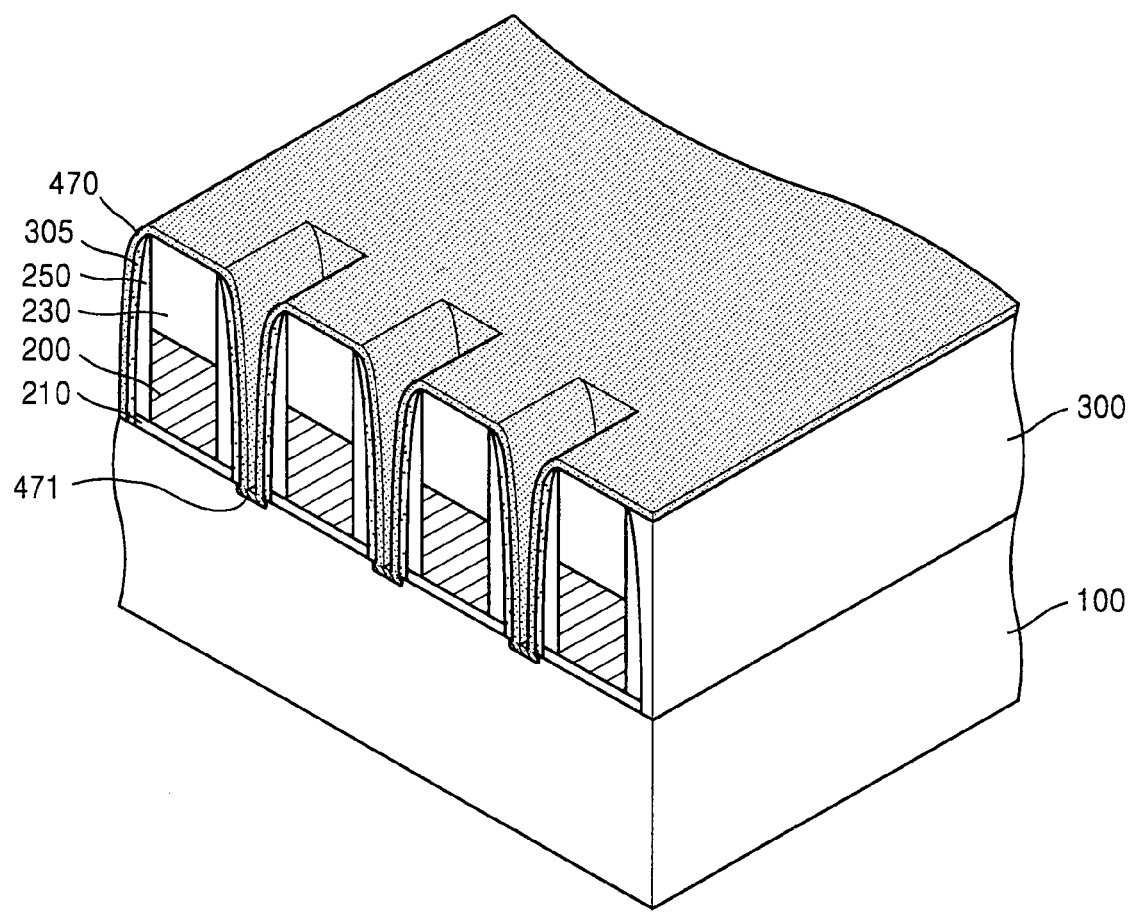

Referring to FIG. 16, a metal layer 470 is deposited to contact bottoms of the contact holes 301. The metal layer 470 is formed of a metal that reacts with silicon so as to generate metal silicide, for example, titanium, cobalt, tungsten, or nickel. The metal layer 470 is formed to a thickness of about 5 Å to 200 Å, using ALD, PVD, or CVD. If the deposition is performed at an environmental temperature that is higher than the temperature needed for metal silicidation, metal elements of the metal layer react with silicon, thus generating a metal silicide layer 471. As shown in FIG. 16, the metal silicide is formed beneath the bottom of the contact hole and has a size that is greater than the size of the bottom of the contact hole. In some embodiments according to the invention, the metal silicide is formed beneath the bottom of the contact hole to extend outward beyond sidewalls of the contact hole.

In some embodiments according to the invention, when a Ti metal layer 470 is deposited by PECVD using $TiCl_4$ as a plasma source, the PECVD can be carried out at an environmental temperature of about 450° C. to about 700° C., which is higher than the temperature needed for Ti silicidation. Thus, the deposition of the Ti layer 470 may facilitate the Ti silicidation to provide for the formation of the titanium silicide layer 471.

In some embodiments according to the invention, radicals such as Cl plasma are generated by exciting $TiCl_4$. The Cl plasma reacts with impurities, native oxides, or polymers, which form a resistive layer on the bottoms of the contact holes 351, which may be more effectively removed by the Cl plasma.

However, if the silicidation reaction is not facilitated by the deposition of the metal layer 470, a metal silicidation process may be induced by performning a RTP process at an environmental temperature of about 300° C. to about 1000° C. or performing an annealing process.

Thereafter, the metal layer 470 and the metal silicide layer 471 are removed from the contact holes 301 by wet etching using a wet etchant for metal stripping, for example, $H_2SO_4$ stripping. Also, the $H_2SO_4$ stripping process may be followed by a dipping process using a diluted HF solution. Although not shown, removing the metal silicide underlying the bottom of the contact hole forms a void that has a size that is greater than the size of the bottom of the contact hole.

By forming and removing the metal layer 470 and the metal silicide layer 471, etch remnants, polymers, and native oxides, which may remain as the resistive layer on the bottoms of the contact holes 301, may be more effectively removed.

It may be difficult to remove silicon nitride remnants generated by the contact hole spacers 305 from the bottoms of the contact holes 301 using a conventional cleaning process. However, when the metal silicide layer 471 is removed as described above, the silicon nitride remnants may be more effectively removed along with the metal silicide layer 471. Also, a plasma damage layer, generated from an etch process for forming the contact holes 301 or the contact hole spacers 305, may be removed from the exposed surfaces of the substrate 100.

Figure 17:
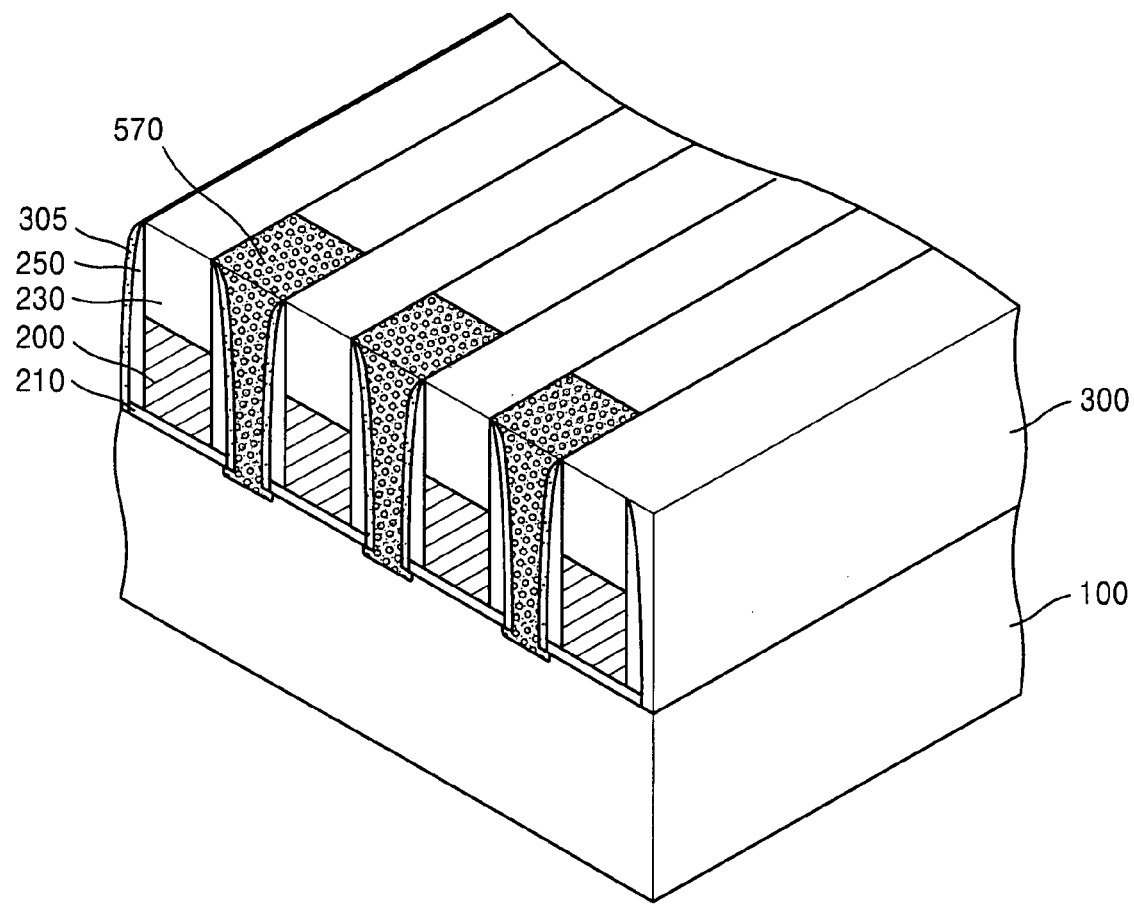

Referring to FIG. 17, after the metal layer 470 and the metal silicide layer 471 are removed, the contact holes 301 can be filled with a conductive material such that interconnection contacts 570, i.e., SAC pads, are formed on the exposed surfaces of the substrate 100.

In some embodiments according to the invention, a contact hole can be formed in an insulating layer to expose a surface of an underlying silicon layer at a bottom of the contact hole having a first size. A metal silicide layer can be formed beneath the bottom of the contact hole and removed to form a void beneath the contact hole having a second size that is greater than the first size. An interconnection contact can be formed in the void having the second size. Accordingly, the size of the interface between the interconnection contact and the underlying silicon layer may be greater than the size of the critical dimension at the bottom of the contact hole, which may provide decreased resistance compared to conventionally formed structures.

In some embodiments according to the invention, a resistive layer, such as etch remnants (e.g., polymers) and native oxides, can be removed from the bottom of a contact hole. Thus, when the interconnection contacts are formed on the bottom of the contact hole, the contact resistance between the interconnection contact and un underlying layer may be reduced while maintaining a relatively small critical dimension at the bottom of the contact hole. Accordingly, if the device is scaled down, the contact resistance between the interconnection contact and the underlying layer may be kept relatively low.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of forming an interconnection contact comprising:
   forming a contact hole in an insulating layer to expose a surface of an underlying silicon layer at a bottom of the contact hole having a first size;
   forming a metal silicide layer beneath the bottom of the contact hole;
   removing the metal silicide layer to form a void beneath the contact hole having a second size that is greater than the first size; and
   forming an interconnection contact in the void having the second size.

2. A method according to claim 1 wherein forming a contact hole further comprises:
   forming a resistive layer at the bottom of the contact hole by forming the contact hole, wherein the resistive layer is removed by removing the metal silicide layer.

3. A method according to claim 1 wherein forming a metal silicide layer beneath the bottom of the contact hole comprises forming the metal silicide layer beneath the bottom of the contact hole to a third size greater than the first size.

4. A method according to claim 2 wherein forming a metal silicide layer beneath the bottom of the contact hole comprises forming the metal suicide layer beneath the bottom of the contact hole to extend outward beyond sidewalls of the contact hole.

5. A method according to claim 1 wherein forming a contact hole further comprises forming a resistive layer at the bottom of the contact hole on the exposed surface the silicon layer.

6. A method according to claim 1 wherein forming a metal suicide layer comprises:
   forming a metal layer in the contact hole at the bottom thereof; and
   annealing or applying a rapid thermal process to the metal layer.

7. A method according to claim 1 wherein forming a metal suicide layer comprises:
   depositing a metal layer at an environmental temperature greater that an environmental temperature needed to react the metal layer with the underlying exposed silicon layer to create the metal suicide layer.

8. A method according to claim 6 wherein the metal layer is deposited at an environmental temperature of about 450°C. to about 700° C.

9. A method according to claim 7 wherein depositing a metal layer comprises depositing the metal layer using atomic layer deposition, chemical vapor deposition, or physical vapor deposition.

10. A method according to claim 7 wherein depositing a metal layer comprises depositing a titanium layer using plasma-enhanced chemical vapor deposition with a titanium source at an environmental temperature of about 450° C. to about 700° C. to form a titanium silicide layer on and beneath the exposed surface of the underlying silicon layer.

11. A method according to claim 1 wherein removing the metal silicide layer comprises wet etching using a $H_2SO_4$-containing wet etchant.

12. A method according to claim 11 further comprising:
   performing a wet treatment using an HF solution after the wet etching.

13. The method of claim 1, wherein the interconnection contacts are formed of a conductive silicon layer.

14. A method of forming an interconnection contact comprising:
   forming an insulating layer on a silicon layer;
   forming a contact hole in the insulating layer to expose a surface of the silicon layer at a bottom thereof having a first size;
   forming a metal layer silicide layer on the exposed surface of the silicon layer;
   removing the metal silicide layer to form a void beneath the exposed surface of the silicon layer that extends outward beyond sidewalls of the contact hole; and
   forming an interconnection contact in the contact hole and in the void.

15. A method of forming interconnection contacts comprising:
   forming spaced-apart gate lines on a substrate;
   forming an insulating layer in gaps between the gate lines;
   forming contact holes by patterning the insulating layer to expose surfaces of the substrate between the gate lines;
   forming a metal layer on bottoms of the contact holes to form a metal silicide layer between the metal layer and the substrate;
   removing the metal suicide layer and the metal layer; and
   forming interconnection contacts that fill the contact holes.

16. A method according to claim 15 wherein forming a metal layer comprises:
   forming the metal layer; and
   thermally treating the metal layer to form the metal suicide layer.

17. A method according to claim 15 wherein forming a metal layer comprises depositing a titanium layer using plasma-enhanced chemical vapor deposition with a titanium source at an environmental temperature of about 450° C. to about 700° C. to form a titanium suicide layer.

18. A method according to claim 15 wherein removing the metal silicide layer and the metal layer comprised wet etching using a $H_2SO_4$-containing wet etchant.

19. A method according to claim 18 further comprising:
   performing a wet treatment using an HF solution after the wet etching.

20. A method of forming interconnection contacts, the method composing:
   forming a first insulating layer on a substrate so that the first insulating layer surrounds first interconnection contacts;
   forming a second insulating layer on the first interconnection contacts;
   forming bit lines on the second insulating layer;
   forming a third insulating layer in gaps between the bit lines;
   forming contact holes in the third insulating layer and in the second insulating layer between the bit lines to expose bottom surfaces of the first interconnection contacts;

forming a metal layer on bottoms of the contact holes to form a metal silicide layer between the metal layer and the substrate;

removing the metal silicide layer and the metal layer; and forming interconnection contacts that fill the contact holes.

21. A method according to claim 20 further comprising:

forming contact hole spacers on sidewalls of the contact holes before forming the metal layer.

22. A method according to claim 20 wherein forming a metal layer comprises:

forming the metal layer; and thermally treating the metal layer to form the metal suicide layer.

23. A method according to claim 20 wherein forming a metal layer comprises depositing a titanium layer using plasma-enhanced chemical vapor deposition with a titanium source at an environmental temperature of about 450° C. to about 700° C. to form a titanium silicide layer.

* * * * *

UNITED STATES PATENT AND TRADEMARK OFFICE
CERTIFICATE OF CORRECTION

PATENT NO. : 7,067,417 B2  Page 1 of 1
APPLICATION NO. : 10/881642
DATED : June 27, 2006
INVENTOR(S) : Park et al.

It is certified that error appears in the above-identified patent and that said Letters Patent is hereby corrected as shown below:

Column 13,
Line 36 should read -- prises forming the metal silicide layer beneath the bottom of --

Line 44 should read -- silicide layer comprises: --

Line 50 should read -- silicide layer comprises: --

Line 54 should read -- silicon layer to create the metal silicide layer. --

Column 14,
Line 33 should read -- removing the silicide layer and the metal layer; and --

Line 40 should read -- silicide layer. --

Line 45 should read -- about 700° C. to form a titanium silicide layer. --

Colum 16,
Line 3 should read -- silicide layer. --

Signed and Sealed this

Fourteenth Day of November, 2006

JON W. DUDAS
*Director of the United States Patent and Trademark Office*

UNITED STATES PATENT AND TRADEMARK OFFICE
CERTIFICATE OF CORRECTION

PATENT NO. : 7,067,417 B2  
APPLICATION NO. : 10/881642  
DATED : June 27, 2006  
INVENTOR(S) : Park et al.

Page 1 of 1

It is certified that error appears in the above-identified patent and that said Letters Patent is hereby corrected as shown below:

Column 13,  
Line 36 should read -- prises forming the metal silicide layer beneath the bottom of --

Line 44 should read -- silicide layer comprises: --

Line 50 should read -- silicide layer comprises: --

Line 54 should read -- silicon layer to create the metal silicide layer. --

Column 14,  
Line 33 should read -- removing the silicide layer and the metal layer; and --

Line 40 should read -- silicide layer. --

Line 45 should read -- about 700° C. to form a titanium silicide layer. --

Column 16,  
Line 3 should read -- silicide layer. --

This certificate supersedes Certificate of Correction issued November 14, 2006.

Signed and Sealed this

Twenty-seventh Day of February, 2007

JON W. DUDAS  
*Director of the United States Patent and Trademark Office*